United States Patent [19]
Favors, Jr. et al.

[11] Patent Number: 6,133,799
[45] Date of Patent: Oct. 17, 2000

[54] VOLTAGE CONTROLLED OSCILLATOR UTILIZING THRESHOLD VOLTAGE CONTROL OF SILICON ON INSULATOR MOSFETS

[75] Inventors: Wesley Favors, Jr., Austin; Eric William MacDonald, Cedar Park; Subir Mukherjee, Austin; Lynn Albert Warriner, Round Rock, all of Tex.

[73] Assignee: International Business Machines Corporation, Armonk, N.Y.

[21] Appl. No.: 09/257,228

[22] Filed: Feb. 25, 1999

[51] Int. Cl.[7] ..................................................... H03B 5/02
[52] U.S. Cl. .................. 331/57; 331/177 R; 331/108 C; 331/175; 327/264
[58] Field of Search .................................... 327/272, 276, 327/277, 278, 264, 178, 184, 129, 231, 234; 331/57, 108 C, 175, 177 R

[56] References Cited

U.S. PATENT DOCUMENTS

| | | | |
|---|---|---|---|
| 5,172,076 | 12/1992 | Brown | 331/57 |
| 5,208,557 | 5/1993 | Kersh, III | 331/57 |
| 5,331,295 | 7/1994 | Jelinek et al. | 331/57 |
| 5,461,585 | 10/1995 | Chonan | 327/264 |
| 5,675,293 | 10/1997 | Lee et al. | 331/57 |
| 5,677,650 | 10/1997 | Kwasniewski et al. | 331/57 |

*Primary Examiner*—Arnold Kinkead
*Attorney, Agent, or Firm*—Casimer K. Salys; Felsman, Bradley, Vaden, Gunter & Dillon, LLP

[57] ABSTRACT

A voltage controlled ring oscillator (VCRO) that can operate at low voltage and provide a variable periodic output. A plurality of transistors form a ring oscillator and a selected transistor in the ring oscillator has a body which can float with respect to ground potential. The selected transistor has a threshold voltage which is controllable by a voltage applied to the transistor body. A control input is coupled to the transistor body such that the body of the transistor can be charged by the control input. Charging the body alters the threshold voltage of the transistor and thereby controls the oscillation frequency of the oscillator.

16 Claims, 6 Drawing Sheets

Fig. 1 *Prior Art*

VOLTAGE CONTROLLED OSCILLATOR UTILIZING THRESHOLD VOLTAGE CONTROL OF SILICON ON INSULATOR MOSFETS

TECHNICAL FIELD

The present invention relates in general to voltage controlled oscillators (VCO), and in particular to a method and system for altering the threshold voltage of Metal Oxide Semiconductor Field Effect Transistors (MOSFETs) to control the operational frequency of an oscillator. Still more particularly, the present invention relates to a method and system which varies MOSFET body voltages to control the operating frequency of a VCO.

DESCRIPTION OF THE RELATED ART

Variable oscillators have been designed in the past utilizing crystal oscillators, direct analog frequency synthesis, numerical control and other methodologies. Each form of oscillator has at least one characteristic that limits its utility at higher frequency ranges. For example, to form a variable oscillator utilizing crystals, plural crystals are required, but it is difficult or impossible to obtain phase coherence between the high number of channels, and frequency accuracy for such a large number of channels presents a costly problem.

Digital phase locked loops have been utilized to provide high frequency variable oscillators. However, digital phase locked loops required bulky off-chip inductors. It is desirable to manufacture phase locked loops having voltage controlled oscillators which are constructed completely of Complimentary Metal Oxide Semiconductor (CMOS) Field Effect Transistors (FETs), without the utilization of off-chip elements such as inductors and capacitors.

The widespread manufacturing capability of CMOS circuits provides relatively inexpensive basic tuning devices for such products as wireless telephones that utilize the gigahertz frequency range. Various forms of inductorless CMOS based ring oscillator designs which utilize one or more rings of inverters are available and currently in production.

Representative oscillators are described in U.S. Pat. No. 5,331,295 issued Jul. 19, 1994, invented by Jules J. Jelinek et al and in U.S. Pat. No. 5,172,076 issued Dec. 15, 1992, invented by Anthony K. D. Brown.

However, it has been found that ring oscillators implemented utilizing bulk CMOS technology have significant limitations including decreased amplitude with increasing frequency, and increased phase noise with increasing frequency. It has been recognized that the phase noise of a ring oscillator is inversely proportional to the voltage transition slope and the node capacitance value. Thus to decrease phase noise, large node capacitance is required. Large capacitances require capacitors that are either located "off-chip", remotely from the integrated circuit on which the oscillator is fabricated, or on an increased silicon area on the integrated circuit.

Referring to FIG. 1 a typical ring oscillator 100 is depicted. First inverter 102, second inverter 104 and third inverter 106 are connected in a series configuration. The output of third inverter 106 is connected to the input of first inverter 102.

A ring oscillator is typically comprised of an odd number of inverters connected in a ring. FIG. 1 depicts a control input 108, typically a voltage, that is also required for driving ring oscillator 100 such that it oscillates at a controlled frequency. Hence, the term voltage controlled oscillator (VCO).

In order to operate a ring oscillator formed of a ring of CMOS inverters the ring of CMOS inverters must be driven such that the oscillator oscillates at a desired frequency. As illustrated in FIG. 1, most VCO designs control the oscillation frequency by changing the ground reference of ring oscillator 100. Control input 108 raises and lowers the ground reference on first inverter 102, depending on the state of transistor 110. Although FIG. 1 depicts the control input 108 as being applied via transistor 110, to only first inverter 102, alternate designs of a ring oscillator 100 may provide a parallel connection among the ground references of all three inverters 102, 104, and 106. Changing the ground reference makes a ring oscillator susceptible to noise. Methods of changing the ground reference also limit signal swing of the oscillation because the rail to rail voltage differential is decreased. For example, if the ground reference of inverter 106 was connected to node 112, its output waveform (which is the oscillator's output) would have a somewhat reduced amplitude.

Modern circuits have much lower operating voltages than previous generations of integrated circuits. A current standard for state-of-the-art integrated circuits is 1.8 volts. Thus controlling a VCO by raising the ground reference to a high voltage typically decreases the allowable signal swing to less than one volt.

It would therefore be desirable to be able to control the oscillation frequency of a voltage controlled oscillator while maintaining a rail-to-rail voltage differential at the oscillator output. Further, it would be desirable to provide a voltage controlled oscillator which has less parasitic capacitance such that the voltage controlled oscillator can operate at higher frequencies.

SUMMARY OF THE INVENTION

It is therefore one object of the present invention to provide a voltage controlled oscillator (VCO).

It is another object of the present invention to provide a method and system for altering the threshold voltage of Metal Oxide Semiconductor Field Effect Transistors (MOSFET) to control the operational frequency of an oscillator.

It is yet another object of the present invention to provide a method and system which varies MOSFET body voltages to control the operating frequency of a VCO.

The foregoing objects are achieved as is now described. A Voltage Controlled Ring Oscillator (VCRO) that can operate at low voltage and provide a variable periodic output is disclosed. A plurality of transistors form a ring oscillator and a selected one of the transistors has a threshold voltage which is controllable by a voltage applied to the transistor body. A control input is coupled to the transistor body such that the body of the transistor can be charged by the control input. Charging the body alters the threshold voltage of the transistor and thereby controls the oscillation frequency of the oscillator.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF ILLUSTRATIVE EMBODIMENT

Figure 1:
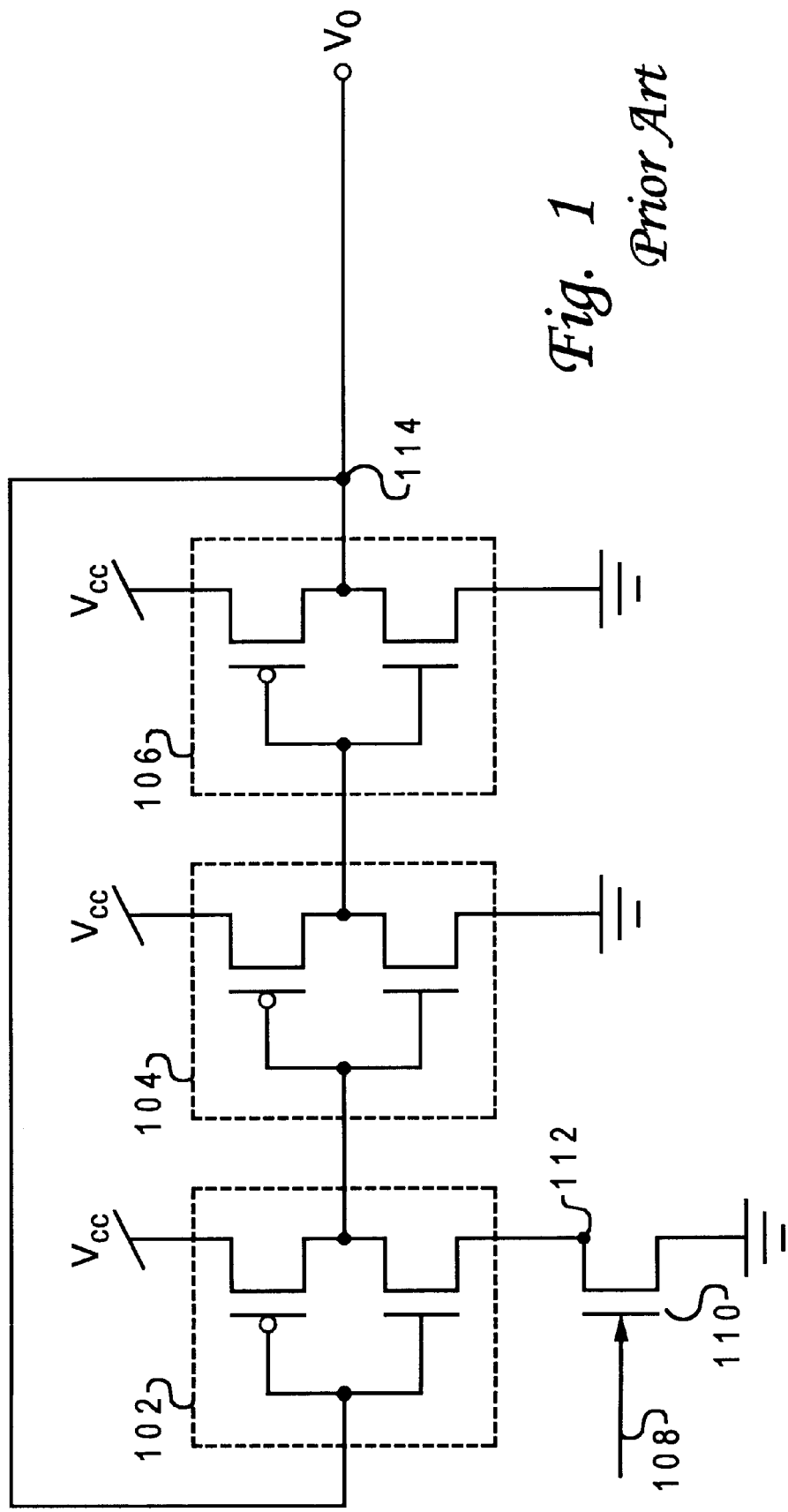
FIG. 1 depicts a schematic representation of a prior art voltage controlled oscillator.
Figure 2:
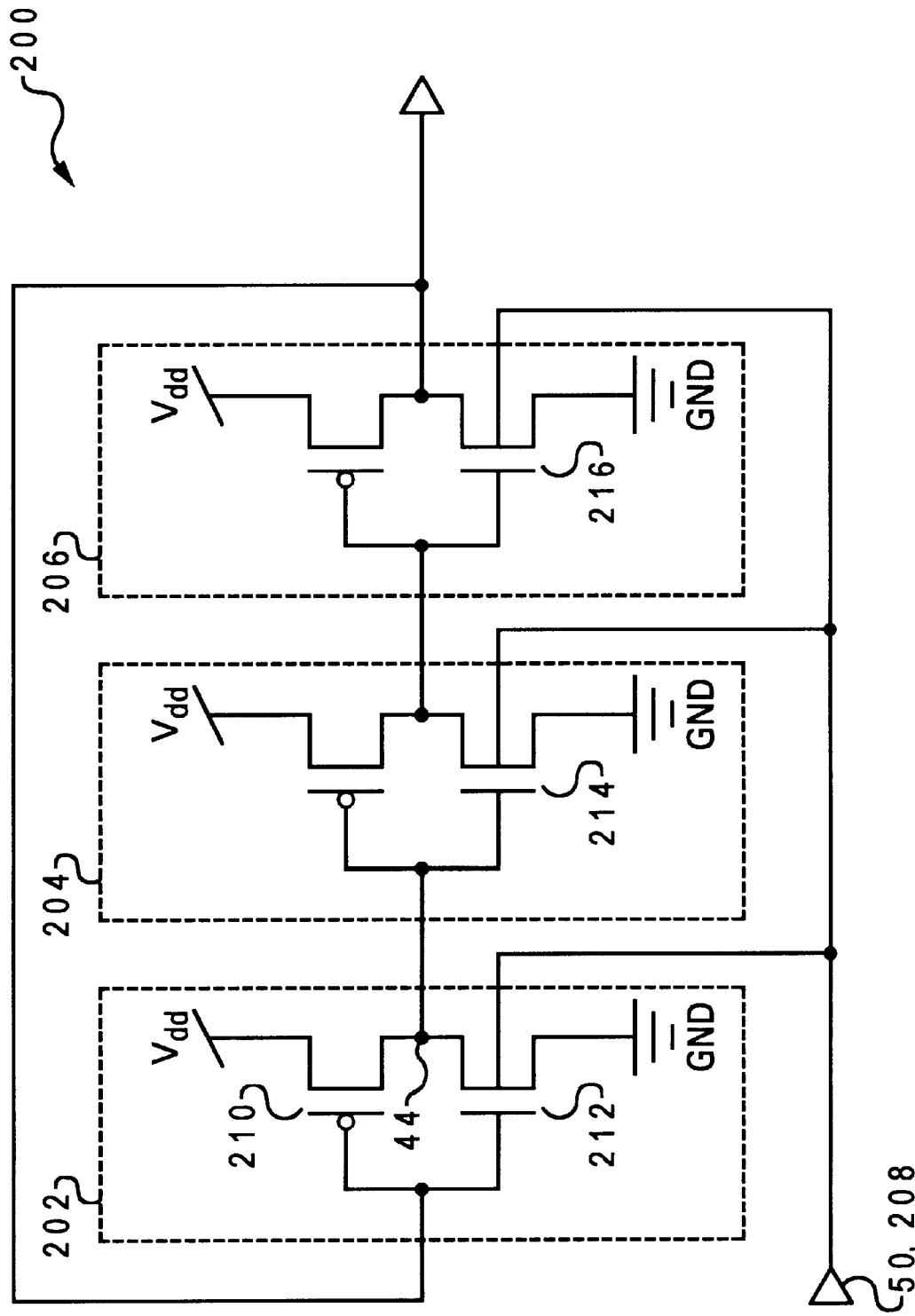
FIG. 2 illustrates a voltage controlled oscillator with body voltage control in accordance with the teachings of the present invention.

With reference now to the figures and in particular with reference to FIG. 2, there is depicted a Voltage Controlled Ring Oscillator (VCRO) 200 formed entirely of CMOS elements. The oscillator is comprised of a series of CMOS inverters wherein a pair of complementary MOSFETS form each inverter, namely input inverter 202, middle inverter 204, and output inverter 206.

FIG. 2 depicts a preferred embodiment of the present invention in which VCRO 200 is comprised of three inverters. It should be noted, however, that alternate embodiments are possible in which different numbers of inverters may be utilized within VCRO 200 and without parting from the scope of the present invention. However, it is essential that the number of inverters comprising the VCO is odd, and is in excess of two. Consistent with fundamental ring oscillator construction, the output of output inverter 206 is connected to the input of input inverter 202. An example implementation of VCRO 200 in accordance with the spirit of the present invention would be within a Phase Locked Loop (PLL) to synchronize the internal clock of a chip with an external clock.

The oscillation frequency of a ring oscillator such as VCRO 200 may be controlled in several ways, but all are based on controlling the rise and fall times of the cascaded inverters. This method of speeding up or slowing down the operation of the inverters is also known as phase shifting. Phase shifting, in the context of VCRO 200, essentially entails altering the effective resistance through inverters 202, 204, and 206.

One method of accomplishing the phase shift necessary to provide variable control of output frequency is to alter or modulate the threshold voltage ($V_t$) of one or more of the transistors that form the inverters of the ring oscillator. Modern semiconductor fabrication processes allow MOSFETs to have switching thresholds on the order of a few hundred millivolts. The threshold voltage is a critical attribute of a circuit. Specifically, superior control of a voltage controlled oscillator can be achieved by maintaining the supply voltage and ground reference yet varying the threshold voltage of the transistors.

The present invention maintains control of threshold voltage in a manner particularly well-suited to CMOS MOSFET device design by utilizing a transistor performance characteristic known as the "body effect". Simply put, the body effect is a phenomena associated with MOSFET transistors in which the voltage differential between the source and transistor body alters the threshold voltage of a transistor. This altered threshold voltage changes the transistor's conductivity from source to drain. Body effect is well known in the art of integrated circuit technology and is incorporated herein by reference.

Returning to FIG. 2, and in accordance with a preferred embodiment of the present invention, frequency control of VCRO 200 begins with a control input 208 that is applied to the bodies of N-MOSFETs 212, 214, and 216. A source of control input 208 is not depicted but may be comprised of feedback circuitry commonly utilized in Phase Locked Loops (PLLs) in which VCOs are often implemented. In the example depicted in FIG. 2, control input 208 is a voltage that, when applied to the bodies of N-MOSFETs 212, 214, and 216, controls the voltage differential between the source and body of each N-MOSFET. This differential is known in bulk CMOS technologies as "substrate bias" ($V_{bs}$) with the resulting effect referred to as "substrate-bias effect" or "body effect".

It is well known in the art of MOSFET devices, that the threshold voltage ($V_t$) (sometimes referred to as the "switching voltage" in digital applications) is a secondary function of $V_{bs}$. Therefore, as control input 208 alters the body voltage of each of N-MOSFETs 212, 214, and 216, the $V_t$ of each N-MOSFET changes, which in turn results in greater or lesser phase shift through each of the N-MOSFETs. This increase or reduction in phase shift will thus directly control the frequency at which VCRO 200 will oscillate. In the case of N-MOSFETs, such as N-MOSFET 212, the $V_t$ varies inversely with body voltage. Therefore, as the voltage applied by control input 208 increases, the $V_t$ of N-MOSFET 212 decreases thus resulting in faster switching speed, a reduced phase shift through inverter 202 and a higher operating frequency of VCRO 200.

A new class of integrated circuits are currently under development. This new class of integrated circuits is a Silicon On Insulator (SOI) design. A preferred embodiment of the method and system of the present invention implements $V_t$ control by capitalizing on the floating body characteristics of SOI CMOS MOSFETs. A preferred embodiment of the present invention is therefore implemented utilizing SOI technology. SOI technology places the carrier transport layer above an insulating layer on a substrate.

The carrier transport layer and transistor body are electrically isolated from the substrate. Therefore, in SOI implementations, transistor bodies are floating with respect to ground and power. A supply is then coupled to the transistor body, and the voltage of the transistor body may thus be varied with respect to power and ground. The threshold voltage of the transistor is inversely proportional to the body voltage.

Figure 3A:
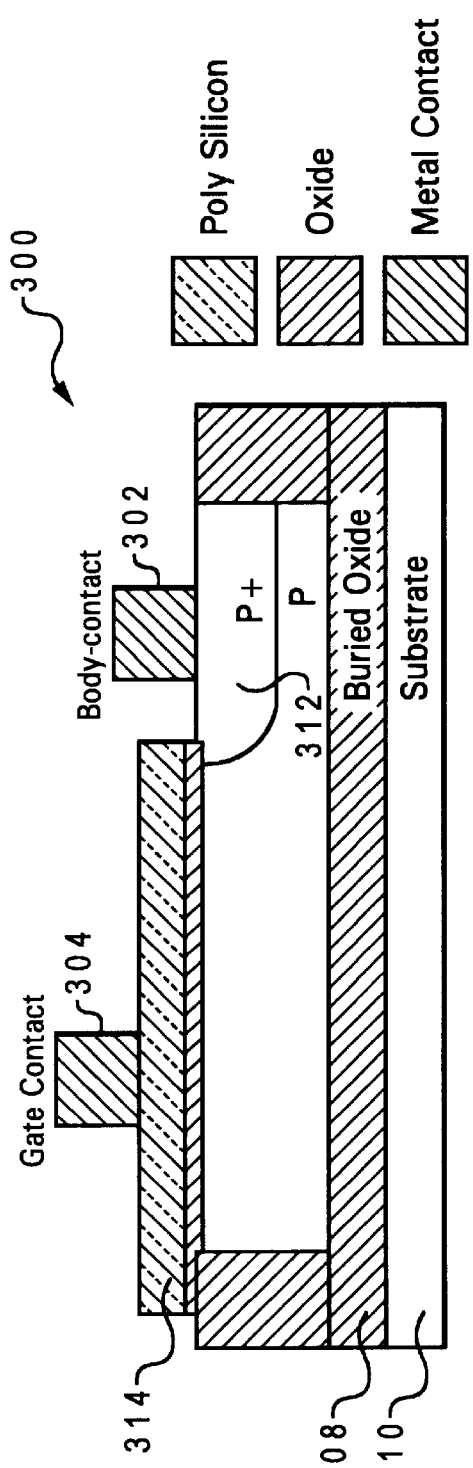
FIG. 3A depicts a cross-section view through the body and gate contact of a body-contacted silicon on insulator (SOI) MOSFET that may be utilized in a preferred embodiment of the present invention.
Figure 3B:
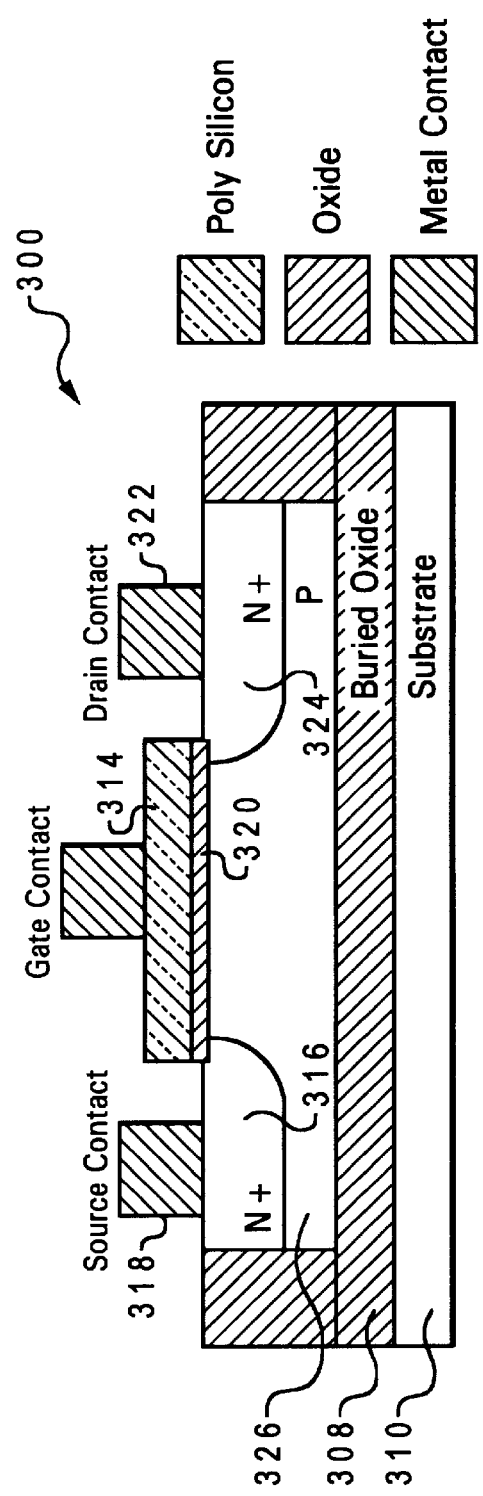
FIG. 3B illustrates a cross-section view through the source and drain contact of a body-contacted SOI MOSFET.

With reference now to FIGS. 3A and 3B, there are depicted a simplified cross-section view of an exemplary body-contacted N-MOS SOI MOSFET 300 that may be utilized in accordance with a preferred embodiment of the present invention. The simplified cross-section view through a gate contact 304 and a body contact 302, depicted in FIG. 3A, best illustrates the particular physical characteristics of N-MOS MOSFET 300 that may be advantageously utilized in a preferred embodiment of the present invention.

The cross section depiction of SOI MOSFET 300 includes gate contact 304, contacting gate 314, and body contact 302, contacting body 312. In accordance with a preferred embodiment of the present invention, and as described with reference to FIG. 2, a control input may be applied to body contact 302 thereby altering the bias applied to MOSFET body 312. As illustrated in FIG. 3A, MOSFET body 312 is electrically insulated from substrate 310 by an insulating layer 308. This insulation between the body and a common substrate is a fundamental characteristic upon which the present invention relies. It is the voltage applied to MOSFET body 312 via body contact 302 that is referred to herein as "body voltage".

Referring now to FIG. 3B, a cross-section view through a source contact 318 and a drain contact 322 of body-contacted SOI MOSFET 300 is illustrated in accordance with the present invention. Carrier transport layer 326 is illustrated adjacent to silicon oxide layer 308. The voltage differential between MOSFET body 312 (the body voltage) and N diffusion 316 (the source of SOI MOSFET 300), is what gives rise to the body effect which may be utilized to alter the threshold voltage of MOSFET 300 in a predictable manner.

A SOI MOSFET is manufactured by creating silicon oxide layer within substrate material 310. A widely utilized substrate material is silicon. The silicon oxide layer can be created by various methods. One method is referred to by those skilled in the art as Separation by Implantation of Oxygen (SIMOX) which is utilized to fabricate SOI CMOS. In a typical SIO method, oxygen is implanted in a single crystal silicon wafer by a bombardment technique which controls the depth of penetration of the silicon substrate by oxygen atoms. Silicon oxide layer 308 is formed below the thin layer of silicon (i.e. carrier transport layer 326) which has been penetrated by oxygen atoms. Alternate methods for forming an insulating layer on a silicon substrate material are of course possible without departing from the spirit or scope of the present invention.

During manufacturing, N diffusions 316 and 324 are formed within carrier transport layer 326. N diffusions 316 and 324 form the drain and source of SOI MOSFET 300. Doping is well known in the manufacture of transistors and will not be discussed herein. A polysilicon layer 314 is formed over surface oxide layer 320. Surface oxide layer 320 is then formed on top of carrier transport layer 326 between N wells 316 and 324.

FIG. 3A and FIG. 3B depict one illustrative structure which can operate in conformance with the present invention. However, many other embodiments utilizing other construction methods could provide a threshold voltage adjusted MOSFET such as SOI MOSFET 300. For example, the present invention is not limited to silicon structures. Silicon germanium and other compounds can provide enhanced performance for applications which have special requirements.

The present invention is particularly useful when implemented utilizing SOI technology. However, any technology which allows bodies of transistors to be controlled could be utilized with the present invention. In accordance with the present invention at least one transistor body in the ring oscillator configuration is charged and when the transistor body is charged, the switching threshold of the transistor decreases. A slight change in the threshold voltage of transistors provides a substantial change in the oscillation frequency.

Referring back to FIG. 2, in a preferred embodiment of the invention, each of the inverters is comprised of a P-MOS FET 210 (i.e. where, in FIG. 3B the drain 324 and source 316 are P-type material), which has its source-drain circuit connected in series with the source-drain circuit of a N-MOS FET 212. The gates of P-MOS FET 210 and N-MOS FET 212 are connected together to form the input to each inverter. The source of P-MOS FET 210 is connected to a voltage rail supplying positive voltage, and the source of N-MOS FET 212 of input inverter 202 is connected to ground.

In accordance with the teachings of the present invention, voltage control is provided by control input 208. Control input 208 is coupled to the body N-MOS FET of input inverter 202, middle inverter 204 and output inverter 206.

In the exemplary embodiment, a control voltage is applied, via control input 208, to the body of the N-MOS FETS of each inverter. However, control over oscillation frequency may be obtained by applying a control input to any number (one or more) of the transistor bodies within each of the inverters. In one such alternate embodiment, a control input may be coupled to body of one or more P-MOS FET transistors. In still another embodiment, control voltages of appropriate polarity may be coupled to the bodies of all of the transistors (i.e. one control voltage applied to all P-MOS FETs and another to all N-MOS FETs). By altering the body voltages and not altering the reference voltage (i.e. the power and common), low voltages can be utilized to power VCRO 200 and not limit the excursions of the signal in the present invention. Additionally, the present invention is much less sensitive to noise than prior art ring oscillators because when a supply voltage of a ground or power reference is altered they can couple noise into the ring oscillator which causes less-than perfect operation.

The output signal of the ring is provided from the common node of the FETs of output inverter 206. The control voltage applied to the bodies of input inverter 202, middle inverter 204 and output inverter 206 must remain sufficiently below the supply voltage such that noise and other interference will not affect the state of the MOSFETS of the inverter. A typical range for the voltage applied via control input 208 may extend from −1.5 volts to +0.6 volts.

When the input to input inverter 202 is a high logic level(high), the output of input inverter 202 is low, the output of middle inverter 204 is high, and the output of output inverter 206 is low. Thus, there is a constant reversal of logic levels at the inputs of each of the inverters. The resulting oscillation frequency is inversely proportional to the propagation delay of the three inverters.

Since the delays are proportional to the output capacitance of the inverters, the maximum frequency is limited by the particular technology utilized. In SOI CMOS technology, the parasitic capacitance of each transistor is much lower than in conventional bulk technology CMOS VCOs. The parasitic capacitance of the inverters is predominantly comprised of the gate capacitances of the FETs in the inverters.

The propagation delay of each inverter is based on the time required to change the output voltage from $V_{dd}$ (the positive voltage rail voltage) to the switching voltage (i.e the threshold voltage) of the following inverter. In this region, the FET is saturated, to a first order approximation. Thus by lowering the threshold voltage of the driven FET the oscillation frequency of VCRO can by increased.

When all N-MOS FETs in VCRO 200 have their bodies coupled to control input 208, three delays of VCRO 200 can be varied. If only one inverter is controlled, the oscillation frequency can be approximated by the inverse of the delay caused by the controlled inverter added to the sum of the delays of the other inverters. The sums of the delays should total 360 degrees.

Figure 4:
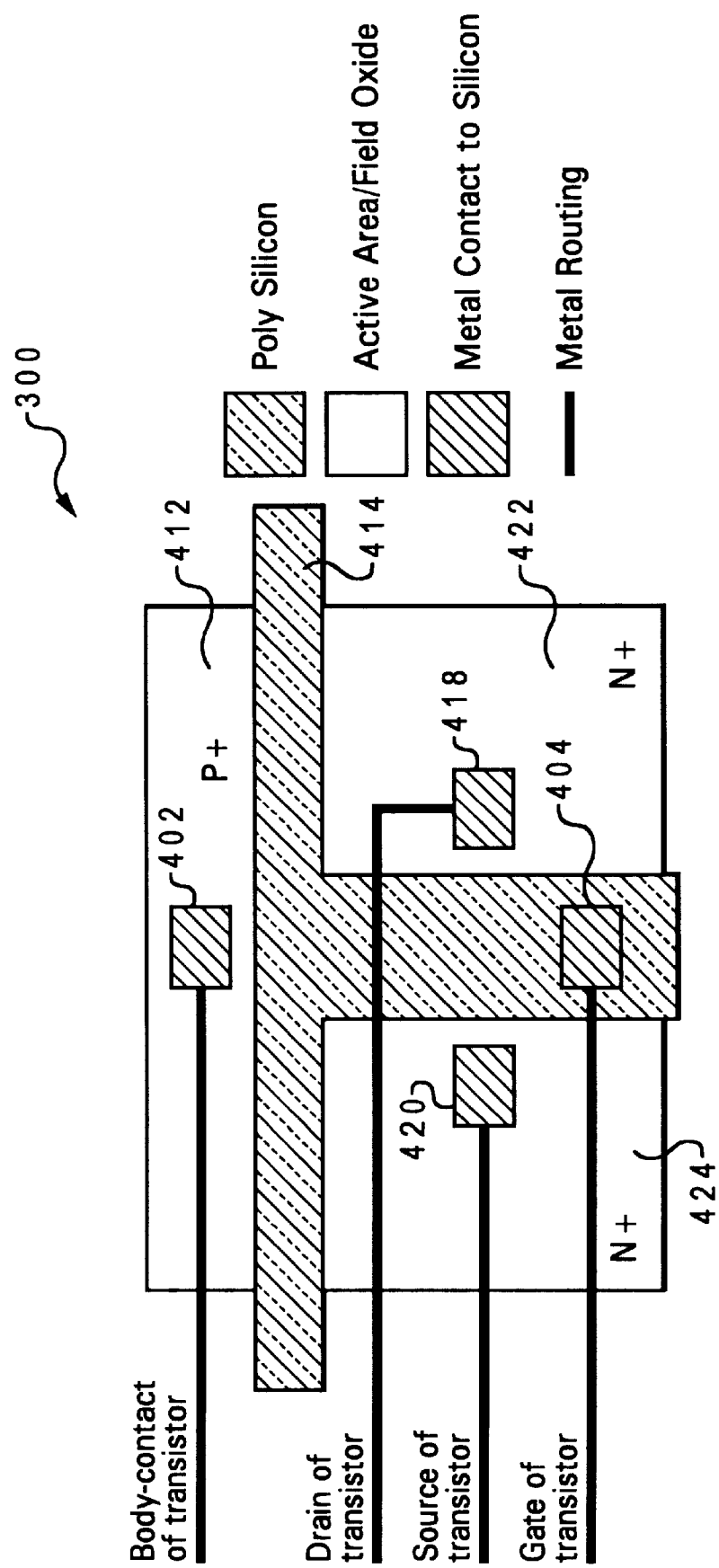
FIG. 4 depicts a top view of the body-contacted SOI MOSFET illustrated in FIGS. 3A and 3B.

With reference now to FIG. 4, a top-view of SOI MOSFET 300 reveals the proximate arrangement of its functional regions and contacts that may be accessed after MOSFET 300 has been fabricated as part of a CMOS inverter such as inverters 202, 204, and 206. As illustrated in FIG. 4, a total of four contacts, including body contact 402, gate contact 404, source contact 420 and drain contact 418, are accessed by metallic conductors. Drain contact 418 is utilized to maintain contact between drain 422 and the drain of its complementary MOSFET (the drain of a P-MOS MOSFET). This electrical contact is depicted as node 44 in FIG. 2. A source contact 420 is utilized to maintain an electrical contact between source 424 and a ground or negative voltage reference. Gate contact 404 is utilized to maintain an electrical connection between gate 414 and the gate of its complementary P-MOS MOSFET. The fourth contact, body contact 402 is utilized in a preferred embodiment of the present invention, to provide electrical access to an otherwise electrically insulated MOSFET body 412.

Figure 5A:
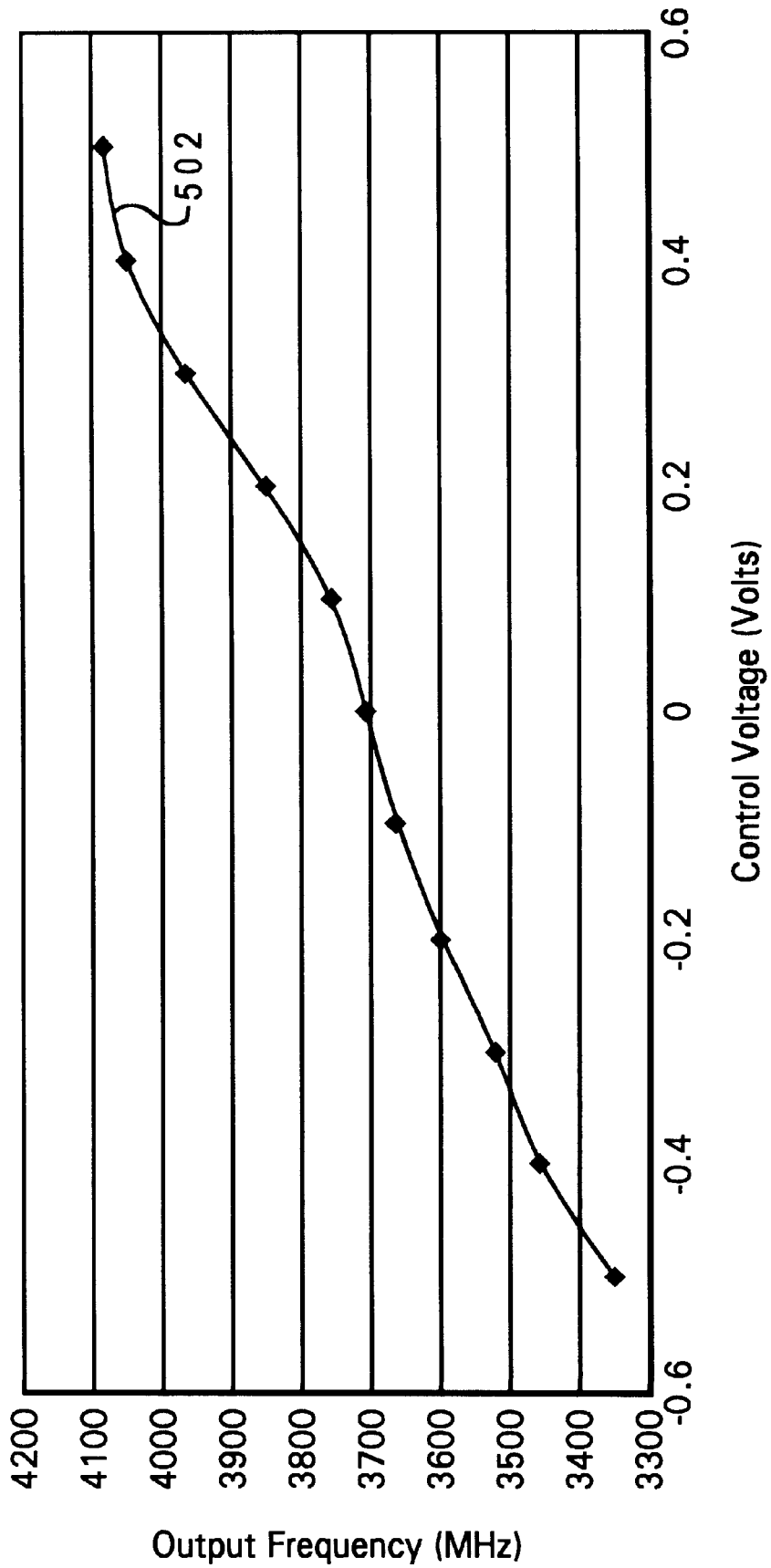
FIG. 5A is a graphical representation of the output frequency response of a voltage controlled ring oscillator in accordance with the teachings of the present invention.

Turning now to FIG. 5, there is depicted a graphical representation of the output frequency response of a voltage controlled ring oscillator in accordance with the teachings of the present invention. A response curve 502 is derived by attaching data points gathered from the output response of a VCRO that is configured in conformity with VCRO 200. Response curve 502 illustrates the relatively linear manner in which the oscillation frequency varies as a function of the voltage applied at a control input such as control input 208.

Figure 5B:
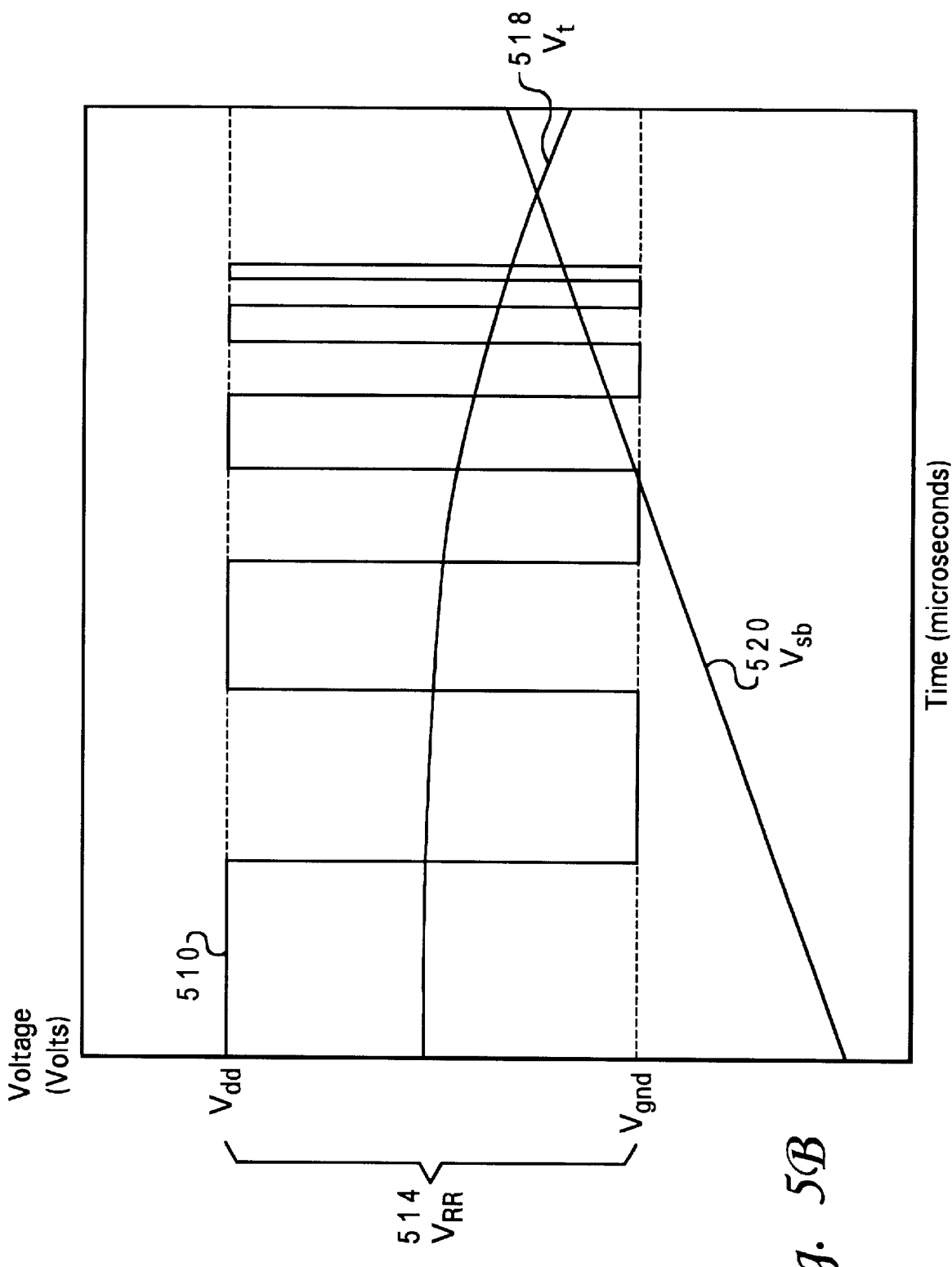
FIG. 5B illustrates an oscillator output signal with a rail-to-rail output amplitude that remains unaffected by an input control voltage.

Another frequency response graph is presented in FIG. 5B which illustrates an oscillator output signal 510 whose frequency increases in response to an increasing control voltage 520. The change in threshold voltage 518, which is a function of control voltage is superimposed for illustrative purposes. As depicted in FIG. 5B, output signal 510 is a squarewave with a peak-to-peak amplitude 514 that is substantially greater than control voltage 520. By applying a control voltage well below the power supply voltage, output signal 510 is subsequently less susceptible to power supply noise. In addition, when control voltage 520 is applied to the output inverter stage of a ring oscillator (as is the case with inverter stage 206, for example) amplitude of output signal 510 will not be reduced but will remain at amplitude 514.

While the invention has been particularly shown and described with reference to a preferred embodiment, it will be understood by those skilled in the art that various changes in form and detail may be made therein without departing from the spirit and scope of the invention.

What is claimed is:

1. A voltage controlled ring oscillator (VCRO) residing on a semiconductor substrate for providing a variable periodic output, said VCRO comprising:

a plurality of transistors forming a ring oscillator, wherein at least one transistor in said plurality of transistors includes a floating body that is electrically insulated from said substrate such that oscillation frequency control is enhanced by reducing body-to-substrate capacitance; and a control input coupled to said floating body of said at least one transistor wherein said floating body is charged by said control input to alter a threshold voltage of said at least one transistor and thereby control an oscillation frequency of said ring oscillator at high frequencies without altering operation of remaining transistors residing on said substrate.

2. The VCRO of claim 1, wherein said ring oscillator includes more than five MOSFET transistors, wherein each of said MOSFET transistors has a threshold voltage and a body voltage, and wherein said threshold voltage is a function of said body voltage.

3. The VCRO of claim 2, wherein said ring oscillator is comprised of n CMOS inverters, wherein n is an odd number greater than one, each of said CMOS inverters having n N-type transistors and n P-type transistors.

4. The VCRO of claim 3, wherein said control input is coupled to all of said N-type transistors.

5. The VCRO of claim 3, wherein said control input is coupled to all of said P-type transistors.

6. The VCRO of claim 1, wherein said plurality of transistors are manufactured utilizing silicon on insulator technology.

7. The VCRO of claim 1, further comprising a CMOS transistor configuration.

8. The VCRO of claim 1, wherein said ring oscillator is operable in the gigahertz frequency range.

9. The VCRO of claim 1, wherein said control input is a voltage signal having a range of −1.5 volts to +0.6 volts.

10. The VCRO of claim 1, wherein said ring oscillator is biased to produce a squarewave output signal.

11. The VCRO of claim 10, wherein said control input includes means for synchronizing said squarewave output signal with an external reference signal, such that said squarewave output may be synchronized with said external reference signal.

12. The VCRO of claim 1, wherein said ring oscillator is biased to produce a sinusoidal output signal.

13. The VCRO of claim 12, wherein a control input signal modulates said output frequency of said sinusoidal output signal.

14. A system for providing variable control of an oscillation frequency of a ring oscillator residing on a semiconductor substrate, said ring oscillator having an output amplitude ranging from a power supply voltage to a ground reference, said system comprising:

a plurality of CMOS FETs forming a ring oscillator wherein at least one of said plurality of FETs has a body that floats with respect to a power supply and a ground reference; and means for coupling a control signal to said floating body of said at least one FET, such that said threshold voltage can be controllably altered and thereby control the oscillation frequency of said ring oscillator at high frequencies without altering operation of remaining FETs residing on said substrate.

15. The system of claim 14 wherein said control signal is a variable voltage source.

16. The system of claim 14 wherein said at least one FET to which said control signal is applied is constructed utilizing silicon on insulator technology.

* * * * *